United States Patent [19]

Pine et al.

[11] Patent Number: 5,467,525
[45] Date of Patent: Nov. 21, 1995

[54] APPARATUS FOR PICKING AND PLACING COMPONENTS USING A MORPHING VACUUM TIP

[75] Inventors: Jerrold Pine; Sunil Lakhani; Stanley Renteria, all of Boca Raton, Fla.

[73] Assignee: Motorola, Inc., Schaumburg, Ill.

[21] Appl. No.: 209,288

[22] Filed: Mar. 14, 1994

[51] Int. Cl.⁶ .................................................. B23P 19/04
[52] U.S. Cl. .................... 29/743; 29/721; 29/DIG. 44; 279/3; 294/119.3
[58] Field of Search ............................ 29/739, 740, 741, 29/743, 760, 720, 721, 832, 833, DIG. 44; 294/64.1, 119.3; 356/123; 901/40, 46, 47; 279/3

[56] References Cited

U.S. PATENT DOCUMENTS

| | | | |
|---|---|---|---|
| 2,929,653 | 3/1960 | Hund et al. | 294/119.3 |
| 4,294,424 | 10/1981 | Teissier | 279/3 X |
| 5,038,466 | 8/1991 | Marozsan et al. | 294/64.1 X |
| 5,131,753 | 7/1992 | Pine et al. | |
| 5,317,803 | 6/1994 | Spigarelli et al. | 29/743 X |

FOREIGN PATENT DOCUMENTS

| | | | |
|---|---|---|---|
| 4007900 | 1/1992 | Japan | 29/743 |
| 4216649 | 8/1992 | Japan | 279/3 |
| 5191092 | 7/1993 | Japan | 29/739 |

*Primary Examiner*—Peter Vo
*Attorney, Agent, or Firm*—Pablo Meles; Daniel K. Nichols; John H. Moore

[57] ABSTRACT

A pick and place machine (30) having morphing vacuum tip (10) comprises a chamber (24) having a sealed first port (25), a filter (22) on a second port (27), and a vacuum (12) on a third port (23), a needle (28) pierced through the sealed first port and through the filter on the second port, wherein a vacuum (14) is placed on the portion of the needle piercing through the sealed first port. Finally, the morphing vacuum tip additionally comprises a non-porous bag (18) having a plurality of fine particles (16) within the bag and an external portion of the bag surrounding a periphery of a portion of the needle pierced through the filter on the second port, the non-porous bag having an open portion being exposed to an external side of the filter on the second port of the chamber, wherein the vacuum on the third port sucks air out of the non-porous bag and the filter prevents the plurality of fine particles from entering the chamber.

17 Claims, 2 Drawing Sheets

APPARATUS FOR PICKING AND PLACING COMPONENTS USING A MORPHING VACUUM TIP

TECHNICAL FIELD

This invention relates generally to end effectors for vacuum pick up and placement of components, and in particular, to a method and apparatus of using a morphing vacuum tip for picking and placing components.

BACKGROUND

Modern electronic manufacturing facilities commonly use pick and place machines for picking and placing components having a wide variety of shapes or configurations. Traditional vacuum tips for these pick and place machines have hard tooled geometries to provide optimal vacuum pick up. As a result, these machines have end effectors having a large complicated assortment of unique tips to place on a variety of components. Many of the components used in electronic products today do not have flat surfaces, but rather it is common to see oval, rounded, and other odd shapes even on surface mounted components. Therefore, there exists a need for a single vacuum tip that can conform to a plurality of geometries and remain rigid until a new geometry is desired.

SUMMARY OF THE INVENTION

A morphing vacuum tip comprises a chamber having a sealed first port, a filter on a second port, and a vacuum on a third port, a needle pierced through the sealed first port and through the filter on the second port, and a vacuum on the portion of the needle piercing through the sealed first port. Additionally, the morphing vacuum tip comprises a non-porous bag having a plurality of fine particles within the bag and an external portion of the bag surrounding a periphery of a portion of the needle pierced through the filter on the second port, the non-porous bag having an open portion being exposed to an external side of the filter on the second port of the chamber, wherein the vacuum on the third port sucks air out of the non-porous bag and the filter prevents the plurality of fine particles from entering the chamber.

In another aspect of the invention, a method of picking and placing a part using a morphing vacuum tip having a non-porous bag, comprises the steps of placing the non-porous bag of the morphing vacuum tip over the part and then vacuuming the air out of the bag allowing the non-porous bag to conform to the shape of a contacted portion of the part being picked up. Then, a seal is formed by vacuuming out the air between the non-porous bag and the contacted portion of the part. Finally, the seal allows the part to be picked up.

DETAILED DESCRIPTION OF THE PREFERRED EMBODIMENT

Figure 1:
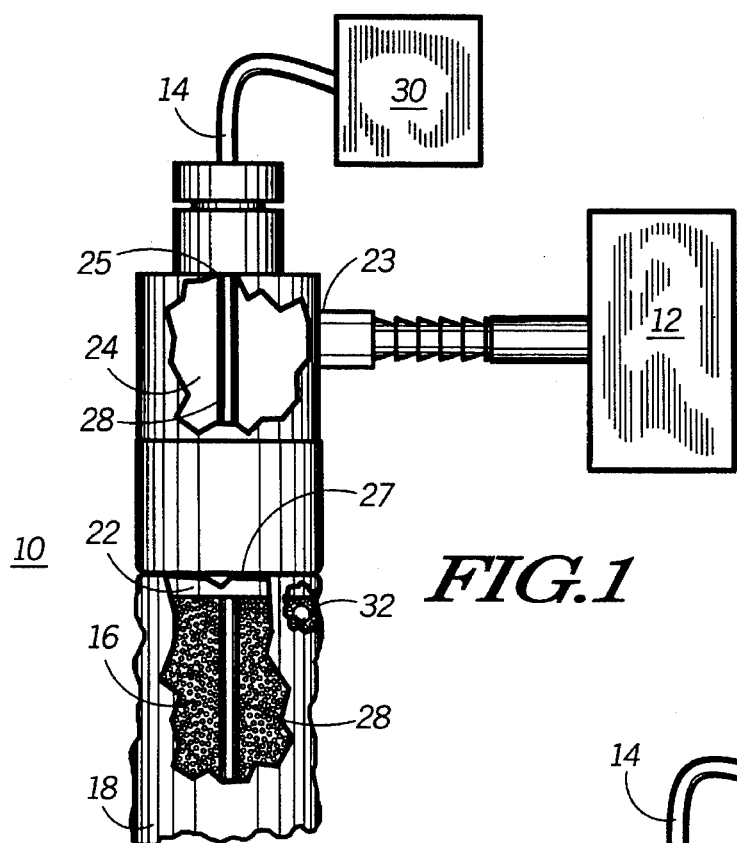
FIG. 1 is front planar view with partial cut views of a pick and place machine having a morphing vacuum tip shown before the pick up of a part in accordance with the present invention.

Referring to FIG. 1, there is shown a pick and place machine 30 having a morphing vacuum tip 10. The morphing vacuum tip 10 preferably comprises a chamber 24 (preferably made of brass fittings) having a sealed first port 25, a filter 22 on a second port 27, and a vacuum 12 on a third port 12. The filter 22, is preferably a micron filter made of porous material such as porous metal. A needle 28 is punctured or pierced through the sealed first port 25 and through the filter 22 on the second port 27. A vacuum 14 is applied to a portion of the needle 28 piercing through the sealed first port 25. A non-porous bag 18 having a plurality of fine particles 16 within the bag 18 has an opening which is attached to the external portion of the filter 22. Preferably the non-porous bag 18 is made of a latex material and the fine particles 16 are very small spherical glass beads. Additionally, the filter 22 should be large enough to allow gases to pass through, but small enough to prevent to entry of the fine particles 16 into the chamber 24. An external portion of the bag 18 should surround the periphery of a portion of the needle 28 pierced through the filter 22 on the second port 27.

Optionally, the bag 18 is made of a translucent material such as translucent latex plastic. Thus, an optional light source 32 can provide back lighting to a part 20 being picked up by shining light through the translucent bag 18 and through the glass beads 16. This back lighting is often used by vision systems in conjunction with pick and place machines to provide a silhouette image to calculate placement location, to insure that parts are picked up in the correct orientation and to insure that the parts are defect free.

Figure 2:
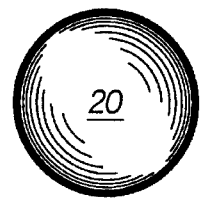
FIG. 2 is another front planar view of a pick and place machine having a morphing vacuum tip shown during the pick up of a part in accordance with the present invention.
Figure 2:
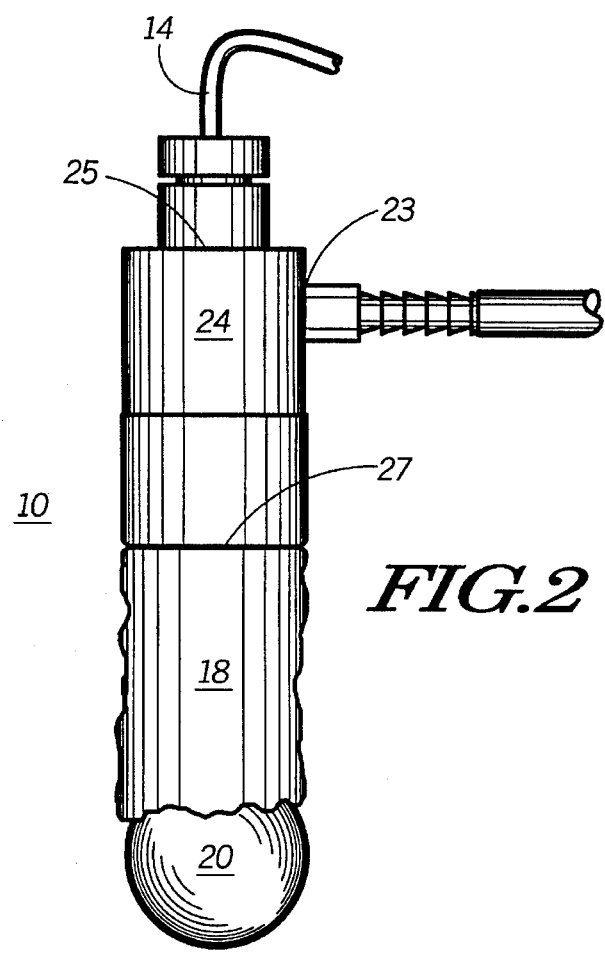
Figure 3:
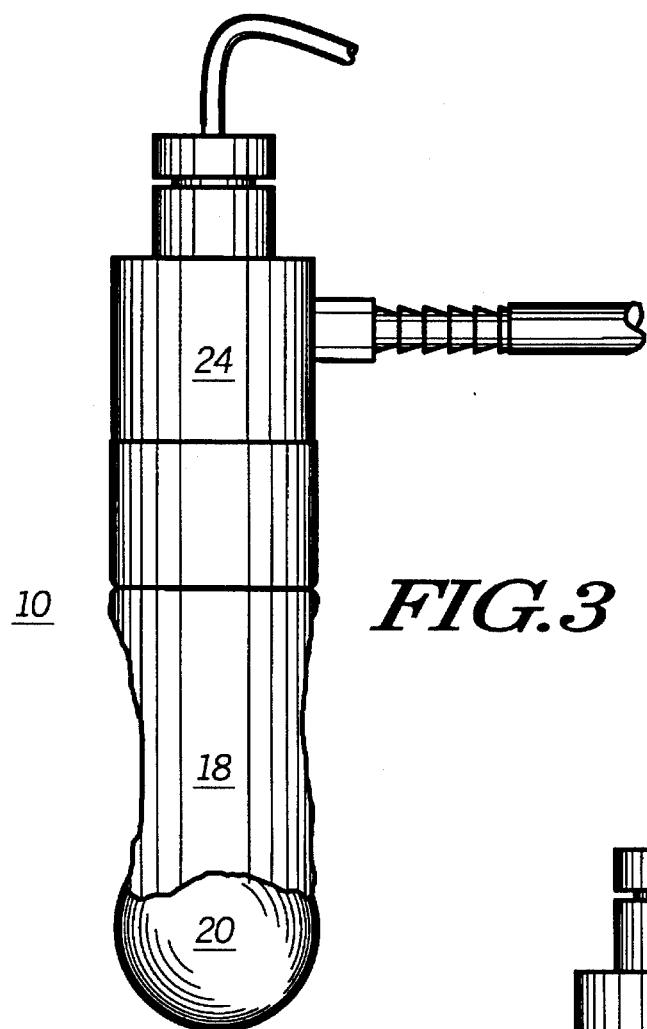
FIG. 3 is another front planar view of a pick and place machine having a morphing vacuum tip shown during the pick up of a part after the application of a vacuum to a bag in accordance with the present invention.
Figure 4:
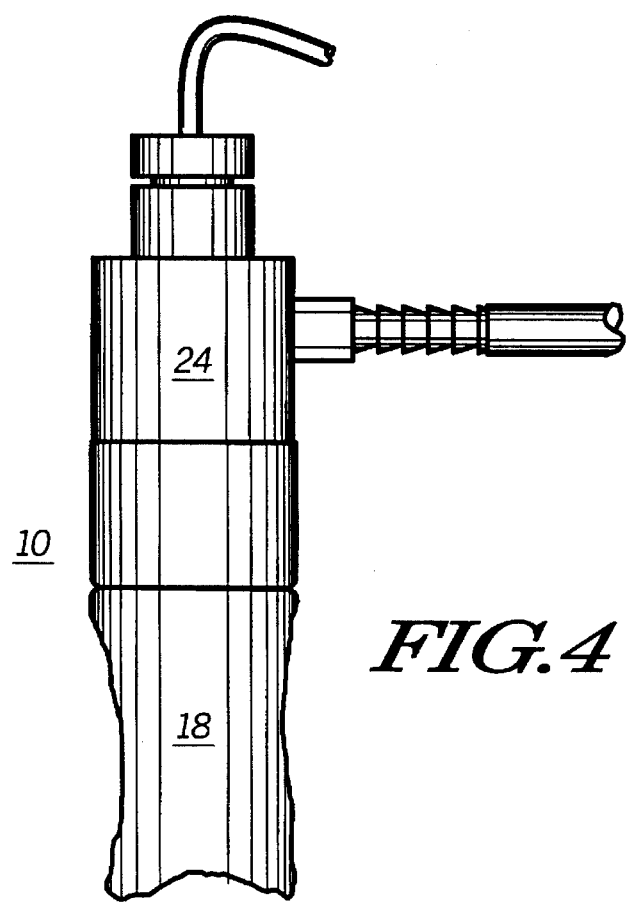
FIG. 4 is another front planar view of a pick and place machine having a morphing vacuum tip shown after the pick up of a part and after the release of a vacuum between the bag and the part, but before the release of the vacuum in the bag in accordance with the present invention.

Operationally, the morphing vacuum tip functions to replace the use of a varied assortment of unique tips, since the vacuum tip can conform to multiple geometries or shapes and remain rigid until a new geometry or shape is desired. Referring to FIG. 1 again, a morphing vacuum tip 10 is illustrated having a non-porous bag 18 that is at least partially inflated with air at ambient atmospheric pressure before the part 20 is acquired. Referring to FIG. 2, the morphing vacuum tip is placed or lowered onto or over the part prior to evacuating the air out of the bag 18. Then, pumping the air out of the bag 18 allows the bag 18 to conform/vacuum form to the shape of the contacted portion of the part being picked up. For instance, if the part has an oblong-oval top surface such as an over-molded pad array carrier (OMPAC) or other glob-top type package or carrier, then the bag will take on the shape of the contacted surface. In this case, a spherical part 20 is shown. Referring to FIG. 3, once the air is taken out of the bag 18, then a seal is preferably formed between the bag 18 (which remains rigid under vacuum) and the contacted portion of the part 20. Then the part can be picked up, transported, rotated and otherwise manipulated as desired without effecting the planar orientation of the part 20 with respect to the pick-up (planar) surface. Once the part is set in the desired location, the part 20 can be placed in the desired location by releasing the vacuum between the bag and the part through the needle 28. Optionally, as discussed before, once the part is picked up, a light source 32 can be used to back light the part by shining a light through the bag 18 and the particles 16 in the bag. This allows a vision system working in conjunction with the pick and place machine to verify and/or correct the orientation of the part as needed.

The present invention has been described in detail in connection with the disclosed embodiments. These embodiments, however, are merely examples and the invention is not restricted thereto. It will be understood by those skilled in the art that variations and modifications can be made within the scope and spirit of the present invention as defined by the appended claims.

What is claimed is:

1. A morphing vacuum tip, comprising:
   a chamber having a sealed first port, a filter on a second port, and a vacuum on a third port;
   a needle pierced through the sealed first port and through the filter on the second port;
   a non-porous bag having a plurality of particles within the bag and an external portion of the bag surrounding a periphery of a portion of the needle pierced through the filter on the second port, the non-porous bag having an open portion being exposed to an external side of the filter on the second port of the chamber, wherein the vacuum on the third port sucks air out of the non-porous bag and the filter prevents the plurality of fine particles from entering the chamber; and
   a vacuum on the portion of the needle piercing through the sealed first port.

2. The morphing vacuum tip of claim 1, wherein each of the plurality of particles are spherical.

3. The morphing vacuum tip of claim 1, wherein the needle provides suction on a component being picked up by the morphing vacuum tip.

4. The morphing vacuum tip of claim 3, wherein a seal is formed between the non-porous bag and the component being picked up as the vacuum on the third port conforms the non-porous bag to the shape of the component and the vacuum on the needle sucks the air between the component and the bag.

5. The morphing vacuum tip of claim 1 wherein the non-porous bag is made out of a compliant elastomeric material such as latex rubber.

6. The morphing vacuum tip of claim 1, wherein the filter is made of porous material capable of allowing air in and out of the chamber, but providing a barrier for particle migration out of the bag.

7. The morphing vacuum tip of claim 1, wherein each of the plurality of particles comprises spherical glass beads.

8. The morphing vacuum tip of claim 7, wherein the non-porous bag is translucent.

9. The morphing vacuum tip of claim 8, wherein light sources are used to shine light through the translucent non-porous bag and through the glass beads within the bag to provide back lighting to a part being picked up and placed.

10. A pick and place machine having a morphing vacuum tip, the vacuum morphing tip comprising:
    a chamber having a sealed first port, a filter on a second port, and a vacuum on a third port;
    a needle pierced through the sealed first port and through the filter on the second port;
    a non-porous bag having a plurality of particles within the bag and an external portion of the bag surrounding a periphery of a portion of the needle pierced through the filter on the second port, the non-porous bag having an open portion being exposed to an external side of the filter on the second port of the chamber, wherein the vacuum on the third port sucks air out of the non-porous bag and the filter prevents the plurality of fine particles from entering the chamber; and
    a vacuum on the portion of the needle piercing through the sealed first port.

11. The pick and place machine of claim 10, wherein the needle provides suction on a component being picked up by the morphing vacuum tip.

12. The pick and place machine of claim 11, wherein a seal is formed between the non-porous bag and the component being picked up as the vacuum on the third port conforms the non-porous bag to the geometry of the component and the vacuum on the needle sucks the air between the component and the bag.

13. The pick and place machine of claim 10 wherein the non-porous bag is made out of a compliant elastomeric material such as latex rubber.

14. The pick and place machine of claim 10, wherein the filter is made of porous material capable of allowing air in and out of the chamber, but preventing the fine particles in the bag from moving into the chamber.

15. The pick and place machine of claim 10, wherein the plurality of particles comprises spherical glass beads.

16. The pick and place machine of claim 15, wherein the non-porous bag is translucent.

17. The pick and place machine of claim 16, wherein light sources are used to shine light through the translucent non-porous bag and through the glass beads within the bag to provide back lighting to a part being picked up and placed.

* * * * *